(12) United States Patent
Cybart et al.

(10) Patent No.: US 10,205,081 B2
(45) Date of Patent: Feb. 12, 2019

(54) MAGNETIC FLUX-TO-VOLTAGE TRANSDUCER BASED ON JOSEPHSON JUNCTION ARRAYS

(71) Applicant: The Regents of the University of California, Oakland, CA (US)

(72) Inventors: Shane A. Cybart, San Diego, CA (US); Travis J. Wong, San Diego, CA (US); Robert C. Dynes, La Jolla, CA (US); Ethan Y. Cho, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 390 days.

(21) Appl. No.: 14/948,169

(22) Filed: Nov. 20, 2015

(65) Prior Publication Data

US 2016/0149111 A1    May 26, 2016

Related U.S. Application Data

(60) Provisional application No. 62/082,537, filed on Nov. 20, 2014.

(51) Int. Cl.
  *H01L 39/02* (2006.01)
  *H01L 39/22* (2006.01)
  *H01L 27/18* (2006.01)

(52) U.S. Cl.
  CPC ............ *H01L 39/025* (2013.01); *H01L 27/18* (2013.01); *H01L 39/225* (2013.01)

(58) Field of Classification Search
  CPC .............................. H01L 39/025; H01L 27/18

USPC ......................................................... 505/162
See application file for complete search history.

(56) References Cited

U.S. PATENT DOCUMENTS

| | | | |
|---|---|---|---|
| 5,326,986 A | 7/1994 | Miller, Jr. et al. | |
| 5,550,101 A * | 8/1996 | Nagata ................. | H01L 39/225 216/3 |
| 5,849,669 A * | 12/1998 | Wen ...................... | H01L 39/225 257/34 |
| 6,362,617 B1 | 3/2002 | Hubbell | |
| 8,179,133 B1 | 5/2012 | Kornev et al. | |
| 2004/0023434 A1 | 2/2004 | Venkatesan et al. | |
| 2004/0145694 A1 | 7/2004 | Segawa et al. | |
| 2004/0266627 A1* | 12/2004 | Moeckly ............... | H01L 39/225 505/100 |
| 2008/0146449 A1* | 6/2008 | Lesueur ................ | H01L 39/225 505/162 |
| 2009/0020701 A1* | 1/2009 | Frey ..................... | G01J 1/02 250/336.2 |

OTHER PUBLICATIONS

Tesche, C.D., et al., "dc SQUID: Noise and Optimization", 1977, J. Low Temp. Phys., 29(3/4):301-331.

(Continued)

*Primary Examiner* — Paul A Wartalowicz
(74) *Attorney, Agent, or Firm* — Eleanor Musick; Musick Davison LLP

(57) ABSTRACT

A device and method for converting magnetic flux to voltage uses a Fraunhofer pattern of a 1D array of long Josephson junctions. The 1D array of Josephson junctions may include from 1 to $10^9$ junctions formed in a planar geometry with a bridge width within the range of 4-10 μm.

24 Claims, 13 Drawing Sheets

(56) References Cited

OTHER PUBLICATIONS

Cybart, S.A., et al. "Very Large Scale Integration of Nanopatterned YBa2Cu3O7-δ Josephson Junctions in a Two-Dimensional Array", Nanoletters, 2009, 9(10): 3581-3585.
Cybart, S.A., et al., "Temporal Stability of Y—Ba—Cu—O Nano Josephson Junctions from Ion Irradiation," IEEE Trans. on Appl. Supercond., 2013, 23(3): 1100103.
Cybart, S.A., et al., "Nano Josephson superconducting tunnel junctions in YBa2Cu3O7-δ directly patterned with a focused helium ion beam", Nature Nanotechnology, 2015, 10 (598-602).
Cho, et al., "YBa2Cu3O7-δ superconducting quantum interference devices with metallic to insulating barriers written with a focused helium ion beam," Applied Physics Letters, 2015; 106 (25):252601.
Roedinger, P., et al., "Fabrication of ARrays of Nano-Superconducting Quantum Interference Devices Using a Double-Angle Processing Approach", IEEE Trans. on Appl. Supercond., 2013 23(3): 1100604.
Cybart, S.A, et al., "Comparison of measurements and simulations of series-parallel incommensurate area superconducting quantum interference device arrays fabricated from YBa2Cu3O7-δ ion damage Josephson junctions," J. Appl. Phys., 2012, 112(6): 063911.

\* cited by examiner

MAGNETIC FLUX-TO-VOLTAGE TRANSDUCER BASED ON JOSEPHSON JUNCTION ARRAYS

RELATED APPLICATIONS

This application claims the benefit of the priority of U.S. Provisional Application No. 62/082,537, filed Nov. 20, 2014, which is incorporated herein by reference in its entirety

FIELD OF THE INVENTION

The present invention relates to a device for converting magnetic flux into a voltage, and more particularly to such a device formed using arrays of Josephson junctions.

BACKGROUND

In conventional antennas, the received electric field component induces a voltage in the antenna which is amplified through resonance. A conventional antenna is referred to as "electrically small" if its size is less than one-quarter of the wavelength of the received electromagnetic radiation for which the antenna is tuned. The utility of these antennas is directly related to the wavelength of the electromagnetic radiation, the size of the antenna, and other known loss factors.

Current techniques for direction finding of incident signals in the high frequency (HF) band (3 to 30 MHz) require antennas that are a significant fraction of a wavelength and which are separated by a distance comparable to a wavelength, which at 3 MHz is 100 meters while at 30 MHz the wavelength is 10 meters. It is not feasible to deploy such systems on mobile platforms, such as trucks, tanks, unmanned autonomous vehicles and planes, the dimensions of which are typically smaller than the wavelength of interest, particularly at the low end of the HF band.

Previous research activities have demonstrated that environmentally noise limited detection can be achieved using superconducting loop antennas, with areas of several square centimeters, when superconducting amplifiers employing Josephson junctions have been used to detect the signal induced in the loop antenna by the incident radiation. The leading technology involves using arrays of superconducting quantum interference devices (SQUIDs). Such devices utilize the interference patterns between two junctions connected in parallel to transduce flux into voltage. A variety of Josephson junction based amplifier configurations have been examined including single SQUIDs (a superconducting circuit containing two Josephson junctions), series arrays of SQUIDs, series-parallel arrays of SQUIDs, (commonly known as Superconducting Quantum Interference Filters (SQIF), a superconducting parametric up-converter amplifier employing a large number of SQUID inductively coupled to a superconducting transmission line, and a long Josephson junction (known as a Josephson Fluxon Anti-Fluxon Transistor (JFAT)). These configurations for Josephson junction amplifiers exhibit gain and low front-end noise over various frequency bands from DC to greater than 20 GHz.

There is an ever-increasing need for wide bandwidth receivers that are compact in physical size and have high data throughput. An ideal system would have bandwidth large enough to replace multiple systems covering different frequency ranges and would reduce the size, weight and power (SWaP) requirements for operation on mobile platforms. Sensors built from high temperature superconducting (HTS) electronics may be able to fill both of these requirements for realization of this need.

Referring to FIGS. 1A and 1B, a Josephson junction is the active element of superconducting electronics formed by two superconducting electrodes 2 separated by a thin normal metal or insulating barrier 4. When a phase difference exists across the barrier, a super current will flow in the absence of a voltage where the critical current is the maximum super current sustainable by the barrier. The current in the electrodes of a Josephson junction is carried on the edges and penetrates transversely into the electrode a distance of the London penetration depth $\lambda$. This value is typically around 200 nm for high transition temperature materials. In the barrier, the current penetrates deeper into the bridge a distance known as the Josephson penetration depth $\lambda_J$, which for ordinary conditions is typically a few microns. When the bridge width W, which corresponds to the geometrical direction perpendicular to the flow of current, is comparable to or less than $\lambda_J$, the current is distributed evenly across the junction. Diagrammatically illustrated in FIG. 1A, these are called "short" junctions, which exhibit a magnetic flux pattern described by the Sinc function (illustrated in the inset.) In contrast, if the junction width is larger than $\lambda_J$, e.g., $2\lambda_J<W$, the current is concentrated at the edges, exhibiting a triangular pattern, as shown in FIG. 1B. These junctions are known as "long" junctions and are undesirable for most SQUID applications because superconducting vortices may enter the junction, generate noise, and corrupt the voltage transfer function.

The critical current of a Josephson junction is a function of magnetic field B given by the Fourier transform of the current density. For a short junction, a rectangular current density yields $I_C(B)=I_C|Sine \ \pi BA/\varphi_0|$, where A is the area of the junction and $\varphi_0$ is the flux quantum. This is called a "Fraunhofer pattern" and is analogous to that seen in optics for single slit diffraction in the small slit limit (slit width-~wavelength). In the case of a long junction, the Fourier transform of the current density (two rectangular pulses) is a triangle. This was experimentally confirmed by Martin et al. in a long YBCO grain boundary junction. This effect may be used to detect magnetic field by DC biasing the junction above the critical current and measuring the resulting voltage. A sensor using a single junction was demonstrated with a voltage-to-magnetic field transfer factor of 50 V/T over a range of about 10 µT. The transfer factor of 50 V/T is modest in comparison to interferometers built from two junctions connected in parallel called SQUIDs (superconducting quantum interference devices). SQUIDs typically achieve $10^5$ V/T and, therefore, have traditionally been assumed to be the magnetic field detector of choice. However, the dynamic range of the SQUID is limited to about 10 nT in comparison to 10 µT for single junctions. Furthermore, the SQUID transfer function is very non-linear, so to utilize it as a detector it is typically connected to feedback electronics that limit the bandwidth to a few MHz.

While progress has been made in the realization of SQUID-based antennas, they are difficult to fabricate because non-uniformity in junction parameters rapidly degrades performance. An alternative approach is needed that is simpler, provides greater signal-to-noise ratio and better performance and is easier to manufacture.

SUMMARY OF THE INVENTION

In an exemplary embodiment, Josephson junction arrays are used to form a small transducer capable of converting magnetic flux into voltage. This transducer, which may also be referred to as a "Fraunhofer-based device" or "Fraunhofer magnetic field sensor-based" ("FMFS-based"), may be used as a magnetic antenna, amplifier or magnetometer with very high linearity, ultra wide bandwidth, large dynamic range and high sensitivity. In general, the inventive approach may be used in any application requiring magnetic field sensing with high linearity and wide bandwidth, including biomedical magnetic imaging and magnetic microscopes. The device of the invention has improved linearity, dynamic range and bandwidth compared to the existing art. Furthermore, fabrication of the device is relatively simple and thus suitable for commercial production. In addition, the device simplifies the support electronics necessary for the implementation in various applications.

Using arrays of very large numbers of nano-Josephson junctions will increase the output voltage and therefore sensitivity. The best Josephson junctions for this are nano-Josephson junctions fabricated with ion beam damage (see K. Chen, S. A. Cybart, and R. C. Dynes, *Appl. Phys. Lett.* 85, p 2863, 2004), because unlike other HTS junction technologies they can be very closely spaced (~150 nm) (see K. Chen, S. A. Cybart, and R. C. Dynes, *IEEE Trans. Appl. Supercond.* 15, p 149, 2005; and S. A. Cybart, K. Chen and R. C. Dynes, *IEEE Trans. Appl. Supercond.* 15, p 241, 2005), positioned anywhere on a substrate and have excellent temporal stability (see S. A. Cybart et al. *IEEE Trans. Appl. Supercond.* 23, p 1100103, 2013.)

The inventive FMFS-based device uses the Fraunhofer pattern of a 1D array for converting magnetic flux to voltage by connecting multiple Josephson junctions in a series array. The FMFS-based device uses the intrinsic Josephson junction sensitivity to magnetic fields to produce a voltage that is a highly linear function of the applied magnetic field. The inventive approach uses a single junction or an array of long junctions in the linear Fraunhofer mode to transduce magnetic fields that are perpendicular to the junction. These magnetic fields can be directly coupled from the environment (magnetometer or antenna), coupled through a flux transformer element (magnetometer or antenna), or coupled from on-chip inductors where the junctions will be used to transduce the current in these inductors to a voltage (current to voltage transducer).

In an exemplary embodiment, the array is lithographically fabricated to form on the order of $10^6$ junctions. In one embodiment, the series, or linear, array of Josephson junctions may be fabricated on a relatively small substrate by configuring it as a meandering line with tens, hundreds, or thousands of meanders. For example, for a 1 cm×1 cm chip, an estimated 400 meanders (25 micron periodicity) with an inter junction spacing of 0.5 microns would yield a total of $8\times10^6$ junctions. Assuming a typical single junction $I_cR$ product of 100 μA×1 Ohms=100 μV and 50% modulation of the critical current to zero, this would yield 400 Volts. If only 25% of this signal has a usable linear range, it would still yield 100 V/10 μT or equivalently $10^7$ V/T, which is two orders of magnitude better than a SQUID with the added benefits of dynamic range, linearity and a bandwidth from DC to GHz.

The general architecture of a FMFS-based device according to the invention can include anywhere from single long Josephson junction up to millions of junctions in series. In addition, series-parallel junction arrays may be used where the Josephson junctions in parallel are connected in such a way that they do not exhibit SQUID properties, i.e., large $\beta_L$ factor ($\beta=I_0(2L/\Phi_0\geq100)$, large inductance, and/or out of plane. The SQUID properties can be avoided by using a large enough inductance connecting the junctions in the parallel direction.

The FMFS-based device exploits the intrinsic Josephson junction sensitivity to magnetic fields to produce a voltage that is a highly linear function of applied magnetic field, i.e. the junction Fraunhofer. A key aspect of the invention is the use of a single junction or an array of long junctions in the linear Fraunhofer mode to transduce magnetic fields that are perpendicular to the junction. These magnetic fields can be directly coupled from the environment (magnetometer or antenna), coupled through a flux transformer element (magnetometer or antenna), or coupled from on-chip inductors where the junctions will be used to transduce the current in these inductors to a voltage (current to voltage transducer).

While the examples described herein refer to YBCO superconductors, the inventive devices may be formed using virtually any superconducting material in which a Josephson junction may be made, including Nb, Pb, Al, $MgB_2$, cuprates, etc. Any junction barrier-type may also be used, including, but not limited to Superconductor-Insulator-Superconductor (SIS), Superconductor-Normal Metal-Superconductor (SNS), and Superconductor-diminished superconductor-Superconductor (SS'S). In addition, while the exemplary embodiments describe ion damage Josephson junctions, the junctions may be formed using any other known method, including, but not limited to SIS trilayer, step-edge junctions, bicrystal junctions, grain boundary junctions, ramp junctions, and others.

The configuration of the junction array may follow any planar geometry, including lines, spirals, circles, meanders, combinations thereof, or any shape that is appropriate for a specific antenna. The planar geometry may optionally include flux focusing elements, or other elements such as flux input elements for current-to-voltage transduction. The device may include any number of elements arranged in a series or parallel relationship. The structures may be resonant or non-resonant, with the broadest bandwidth being achieved with non-resonant structures.

In one aspect of the invention, a transducer for converting magnetic flux to voltage comprising an array of Josephson junctions disposed in a planar geometry configured to operate in a linear Fraunhofer mode to transduce magnetic fields that are perpendicular to the junction. The array may include from 1 to $10^9$ junctions where the Josephson junctions are long Josephson junctions, which may have a bridge width within a range of 4-10 μm. In some embodiments, the planar geometry may be a meandering line. Such a meandering line may include from 10 to $10^6$ meanders. In other embodiments, the planar geometry may be selected from lines, spirals, circles, meanders, or combinations thereof. The array may be arranged in series, parallel, or series-parallel. The transducer may further comprise a plurality of bond pads in electrical communication with the array. In some embodiments, the array of Josephson junctions is formed from an YBCO superconductor, while in others the array of Josephson junctions is formed in a superconducting material selected from the group consisting of Nb, Pb, Al, $MgB_2$, and cuprates. The Josephson junctions may comprise junction barriers selected from the group consisting of Superconductor-Insulator-Superconductor (SIS), Superconductor-Normal Metal-Superconductor (SNS), and Superconductor-diminished superconductor-Superconductor (SS'S) with junctions selected from the group consisting of ion damage Josephson junctions, SIS trilayers, step-edge junctions, bicrystal junctions, grain boundary junctions, and ramp junctions.

In another aspect of the invention, a device for converting magnetic flux to voltage comprises a planar array of long Josephson junctions disposed on a substrate, where the planar array is configured in a geometry selected from a line, spiral, circle, meandering line, and combinations thereof; and a plurality of contacts disposed on the substrate in electrical communication with the planar array. The planar array may include from 1 to $10^9$ junctions. The Josephson junctions within the array are long Josephson junctions. In some embodiments, the geometry is a meandering line having from 10 to $10^6$ meanders. In other embodiments, the planar geometry may be selected from lines, spirals, circles, meanders, or combinations thereof. The array may be arranged in series, parallel, or series-parallel. In some embodiments, the array of Josephson junctions is formed from an YBCO superconductor, while in others, the array of Josephson junctions is formed in a superconducting material selected from the group consisting of Nb, Pb, Al, $MgB_2$, and cuprates. The Josephson junctions may comprise junction barriers selected from the group consisting of Superconductor-Insulator-Superconductor (SIS), Superconductor-Normal Metal-Superconductor (SNS), and Superconductor-diminished superconductor-Superconductor (SS'S) with junctions selected from the group consisting of ion damage Josephson junctions, SIS trilayers, step-edge junctions, bicrystal junctions, grain boundary junctions, and ramp junctions.

In another aspect of the invention, a method for converting magnetic flux to voltage comprises using a Fraunhofer pattern of a 1D array of Josephson junctions. The 1D array of Josephson junctions may include from 1 to $10^9$ junctions. The Josephson junctions within the array are long Josephson junctions and may be configured in a planar geometry selected from a line, spiral, circle, meandering line, and combinations thereof. In some embodiments, the planar geometry is a meandering line having from 10 to $10^6$ meanders. The array may be arranged in series, parallel, or series-parallel. In some embodiments, the array of Josephson junctions is formed from an YBCO superconductor, while in others, the array of Josephson junctions is formed in a superconducting material selected from the group consisting of Nb, Pb, Al, $MgB_2$, and cuprates. The Josephson junctions may comprise junction barriers selected from the group consisting of Superconductor-Insulator-Superconductor (SIS), Superconductor-Normal Metal-Superconductor (SNS), and Superconductor-diminished superconductor-Superconductor (SS'S) with junctions selected from the group consisting of ion damage Josephson junctions, SIS trilayers, step-edge junctions, bicrystal junctions, grain boundary junctions, and ramp junctions.

DETAILED DESCRIPTION OF EMBODIMENTS OF THE INVENTION

A Fraunhofer magnetic field sensor (FMFS)-based device is formed from an array of Josephson junctions to produce increased voltage yield, improved sensitivity, and signal-to-noise ratio well beyond that obtainable from SQUID devices. The inventive devices are capable of operation above the boiling point of liquid nitrogen, can be very densely spaced~500 nm, easily manufactured, are uniform to better than 10% variation with excellent temporal stability. Utilization of wide junctions greatly simplifies photolithography while increasing sensitivity and linearity. The voltage obtainable by large linear arrays according to the FMFS junction technology is unsurpassed due to the large number of junctions possible.

Figure 1A:
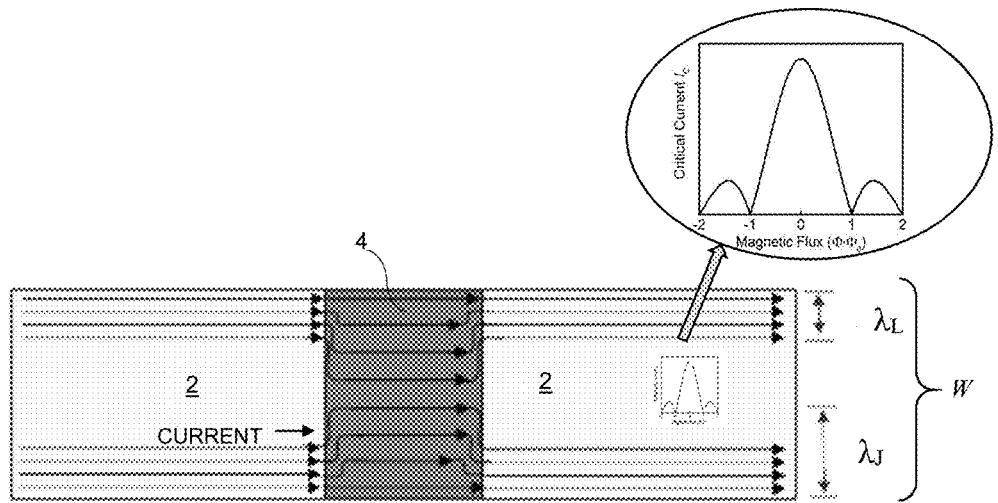
FIGS. 1A and 1B are diagrammatic views of short and long Josephson junctions depicting current density distribution (prior art).
Figure 1B:
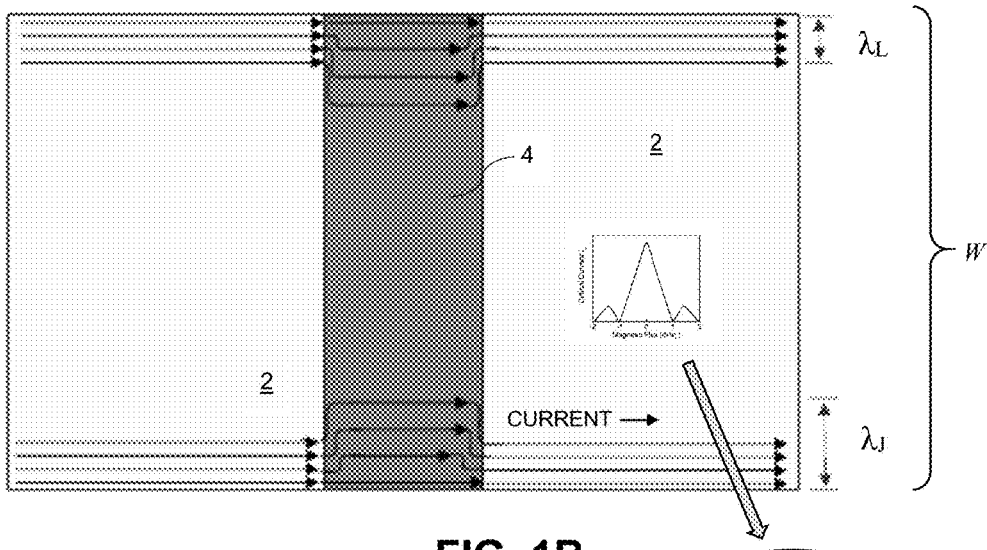
Figure 2A:
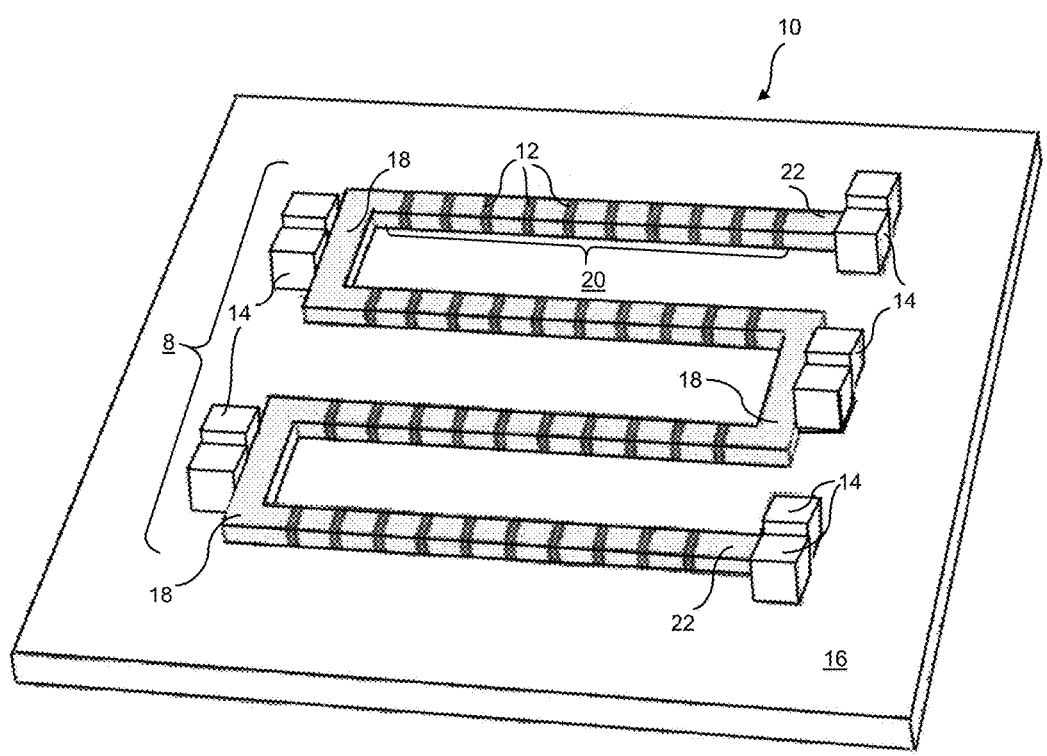
FIG. 2A is a diagrammatic perspective view of a device constructed with a meandering geometry according to an embodiment of the present invention.

FIG. 2A diagrammatically illustrates an example of a FMFS-based device 10 fabricated on 1 cm×1 cm substrate 16 consisting of a series array 8 of Josephson junctions 12 arranged in a meander geometry. Each of the junctions 12 is a long Josephson junction, i.e., one in which the junction width is larger than $\lambda_J$ so that the current is concentrated at the edges. (See, e.g., FIG. 1B.) Lines of Josephson junctions 12 define a meander leg 20, with pairs of meander legs 20 joined by superconducting bridge switch-backs 18. For simplicity in illustration, in FIG. 2A, each meander leg 20 is shown as having ten (10) Josephson junctions 12, however, it will be readily apparent to those in the art that the number of junctions within a meander leg or within the entire meander structure will be selected based on a number of factors including, but not limited to, fabrication methods and desired device characteristics. Selection of appropriate numbers of junctions, inter junction spacing, numbers of meanders and their dimensions will be within the level of skill in the art based on the examples described herein. Contacts 14 disposed at the switch-backs 18 and at the meander ends 22 provide for external connection. The contacts 14 may be gold bond pads or other appropriate conductors.

Figure 2B:
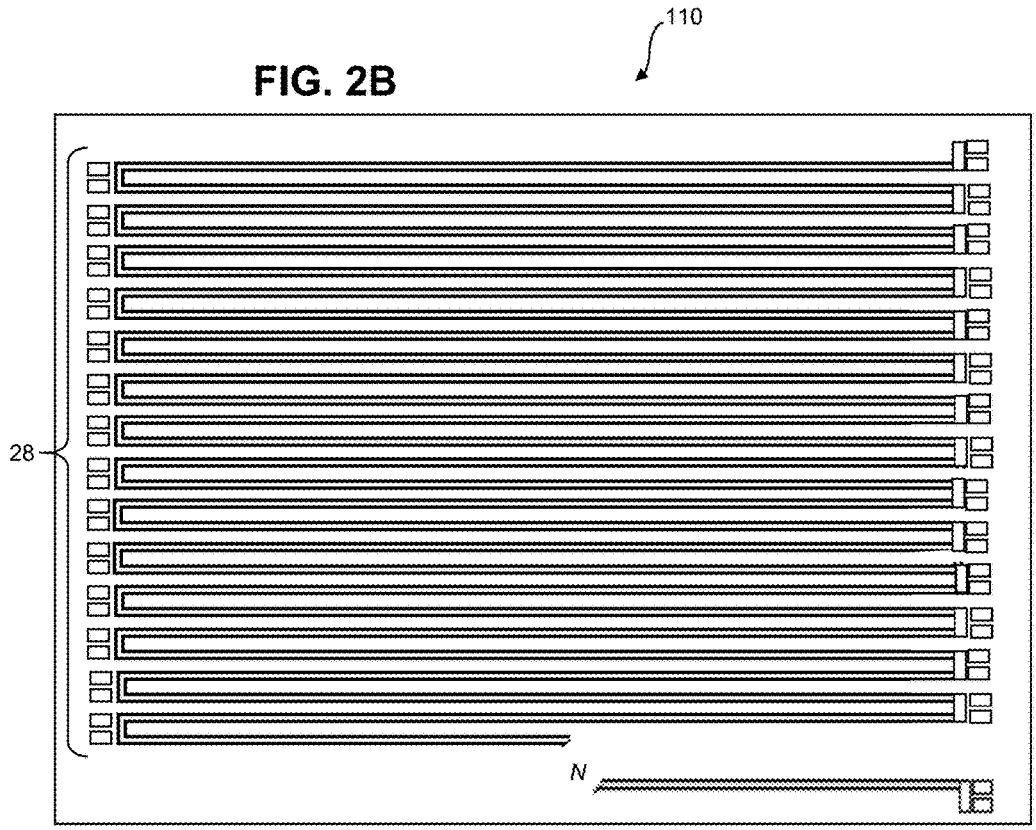
FIG. 2B is a top plan view of an embodiment of the FMFS device.

FIG. 2B provides a diagrammatic top view of an embodiment of a FMFS-based device 110 shown with a larger number N of meanders 28, but otherwise configured using with the same basic elements as described with reference to FIG. 1B. The meanders may number on orders of magnitude of 10 to $10^6$ or more, with junctions numbering from a single junction to billions ($10^9$) or more, limited only by practical fabrication constraints, to achieve the desired performance, with the substrate size being scaled as needed.

Modestly estimating 400 meanders (25 micron periodicity) with 200 switch-backs and an inter junction spacing of 0.5 microns would yield a total of $8 \times 10^6$ junctions. Assuming a typical single junction $I_C R$ product of 100 μA×1 Ohms=100 μV and 50% modulation of the critical current to zero, this would yield 400 Volts. If only 25% of this signal has a usable linear range, it would still yield 100 V/10 μT, or equivalently $10^7$ V/T, which is two orders of magnitude better than a SQUID with the added benefits of dynamic range, linearity and a bandwidth from DC to GHz. An additional benefit Fraunhofer devices may have over SQUID devices is lower noise properties.

The general architecture of a FMFS-based device according to the invention can include anywhere from single long Josephson junction up to millions of junctions in series. In addition, series-parallel junction arrays may be used where the Josephson junctions in parallel are connected in such a way that they do not exhibit SQUID properties, i.e., large $\beta_L$ factor ($\beta = I_0(2L/\Phi_0 \geq 100$), large inductance, and/or out of plane. (See, e.g., Tesche and Clarke, *J. Low Temp. Phys.*, Vol. 29, No. 3/4, 1977.) The SQUID properties can be avoided by using a sufficiently large inductance connecting the junctions in the parallel direction.

While the examples described herein refer to YBCO ($YBa_2Cu_3O_{7-\delta}$) superconductors, the inventive devices may be formed using virtually any superconducting material in which a Josephson junction may be made, including Nb, Pb, Al, $MgB_2$, cuprates, etc. Any junction barrier-type may also be used, including, but not limited to Superconductor-Insulator-Superconductor (SIS), Superconductor-Normal Metal-Superconductor (SNS), and Superconductor-diminished superconductor-Superconductor (SS'S). In addition, while the exemplary embodiments describe ion damage Josephson junctions, the junctions may be formed using any other known method, including, but not limited to SIS trilayer, step-edge junctions, bicrystal junctions, grain boundary junctions, ramp junctions, and others.

Figure 2C:
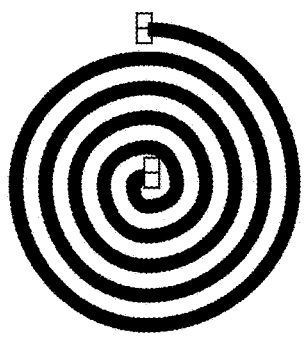
FIG. 2C is a diagrammatic view of an exemplary spiral geometry.
Figure 2D:
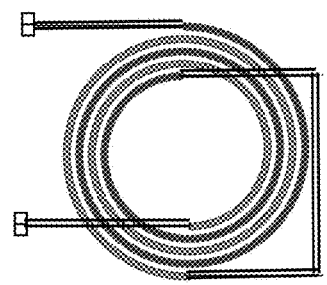
FIG. 2D is a diagram of an exemplary double spiral configuration.
Figure 2E:
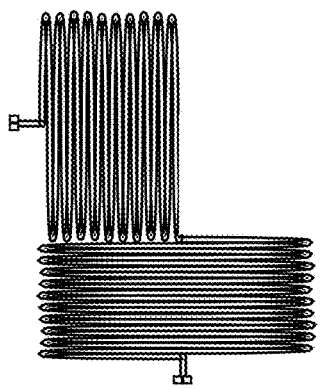
FIG. 2E is a diagram of a planar layout with groups of meanders in different orientations.

Appropriate configurations of the planar array of Josephson junctions extend far beyond the meandering line geometry described in the exemplary embodiment. The configuration of the junction array may follow any planar geometry, including lines, spirals, circles, meanders, combinations thereof, or any shape that is appropriate for a specific antenna. FIGS. 2C-2E illustrate a few possible planar geometry configurations, showing a spiral (FIG. 2C), a double spiral (FIG. 2D) or groups of meanders in different orientations (FIG. 2E). Many other configurations are possible. The planar geometry may optionally include flux focusing elements, or other elements such as flux input elements for current-to-voltage transduction. The device may include any number of elements arranged in a series or parallel relationship. The structures may be resonant or non-resonant, with the broadest bandwidth being achieved with non-resonant structures.

With regard to the junction spacing, there is no limit to the spacing for the invention described. For any given junction technology, any range of spacings that can produce Josephson junctions will be within the scope of the invention. The highest density of junctions is set by the practical fabrication limits. For a high voltage output in a small area, a high density junction technology is most desirable. For improved coupling of the device to external HF fields, a large area is desirable. For an RF device, a distributed array of a limited number of junctions is preferred. For example, with 1 Ohm junctions matching a 50 Ohm load, radio frequency power is most efficiently transduced for approximately 50 junctions rather than millions.

Figure 3A:
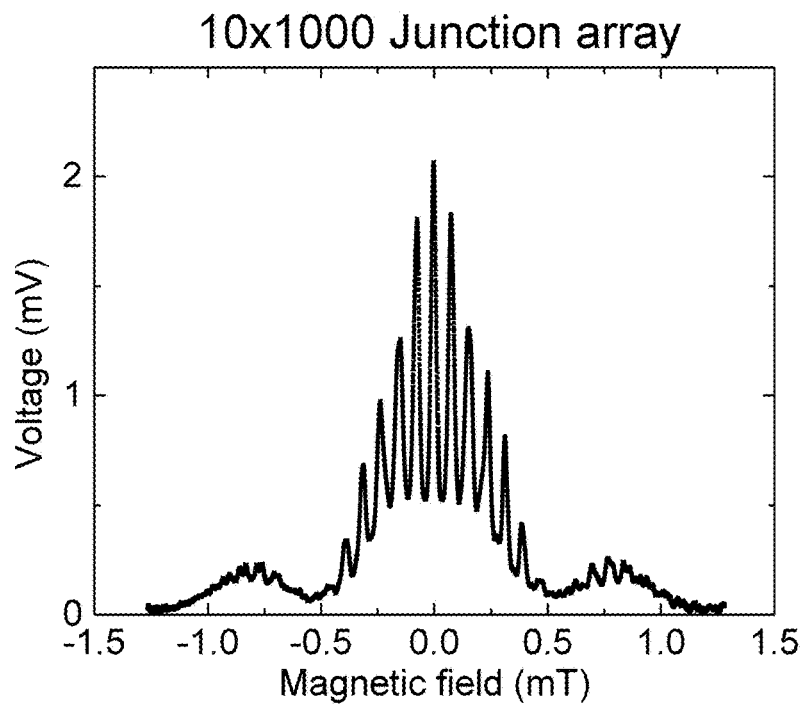
FIG. 3A is a plot showing the Fraunhofer and SQUID pattern for a 10×1000 two dimensional SQUID array fabricated with 2 micron wide junctions.
Figure 3B:
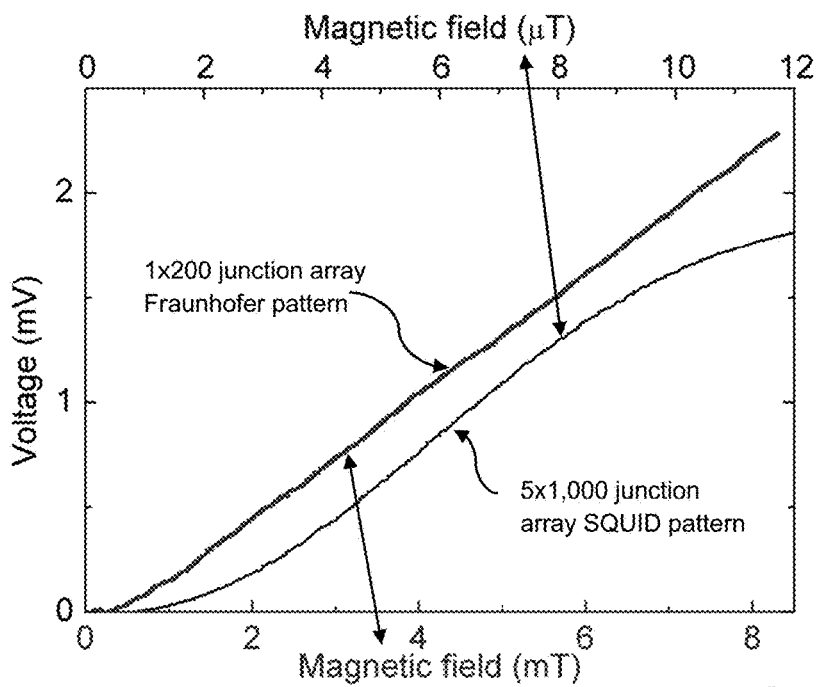
FIG. 3B is a plot comparing the linearity of the Fraunhofer and SQUID patterns.

The inventive FMFS-based device uses the Fraunhofer patterns of a 1D array in contrast to a 2D array used in a SQUID array. FIG. 3A shows the magnetic field response of a 2D 10×1000 junction array (SQUID array). Josephson junctions exhibit both interference and diffraction. Small oscillation (quantum interference) from the SQUID areas and large oscillation (quantum diffraction) are determined by the junction area. The sharp Fraunhofer modulation of the SQUID transfer function is an indicator that the junctions have uniform areas and critical currents. A 1D array exhibits only the Fraunhofer pattern, which is far more linear that the SQUID pattern and has a dynamic range that is about 1,000 times larger. FIG. 3B illustrates how the Fraunhofer regime (upper line–1×200 junction array) is very linear compared to a SQUID array (lower line–5×1000 junction array) while having a much larger dynamic range. (Note that the upper axis scale (in μT) corresponds to the SQUID pattern while the lower axis scale (in mT) corresponds to the Fraunhofer pattern, as indicated by the double arrows.) To achieve the same sensitivity as a SQUID, it is simply a matter of increasing the number of junctions to scale up the voltage.

Using photolithographic processes an array comprising a large number (on the order of hundreds to multiple millions) of Josephson junctions is formed on a substrate. The FMFS devices may be fabricated by a number of different process, including conventional photolithographic processes as are known in the art, and the photolithographic processes described by S. A. Cybart, et al. in "Very Large Scale Integration of Nanopatterned $YBa_2Cu_3O_{7-\delta}$ Josephson Junctions in a Two-Dimensional Array", *Nanoletters*, 2009, Vol. 9, No. 10, 3581-3585, which is incorporated herein by reference.

Briefly, the process described by Cybart, et al., involves the steps of thermal co-evaporation of a superconducting, e.g., YBCO, thin film on a sapphire wafer followed by deposition of a gold contact layer. The films are patterned using photolithography and argon ion ($Ar^+$) milling to fabricate a microstrip. The gold layer over the junctions was removed using a subsequent photolithography step and chemical gold etch, leaving the contact pads. The junctions are fabricated by coating the wafer with a layer of photoresist, which is then hardbaked, to serve as the primary ion stopping layer. A thin (e.g., 25 nm) layer of germanium (Ge) may be electron-beam evaporated on top of the resist to also serve as an etch stop. A layer of poly(methyl methacrylate) (PMMA) resist is spun onto the Ge layer for electron-beam lithographic patterning. Using an e-beam writer, such as a 100 keV Leica VB6-HR nanowriter, or similar conventional e-beam system, lines are written into the PMMA over the locations intended for the junctions. This pattern is transferred into the Ge layer by reactive ion etching (RIE) in a HBr—Cl$_2$ plasma etcher. The pattern in the Ge is transferred to the resist using low temperature (~−100° C.), low pressure (5 mTorr) oxygen RIE. Following etching, the wafers are implanted to induce ion damage in the areas not protected by the mask. The implant dose will depend on the desired junction parameters.

An alternative fabrication method is disclosed in co-pending International Application No. PCT/US2015/035426, filed Jun. 11, 2015, which is incorporated herein by reference. The process is also described by S. A. Cybart, et al., in "Nano Josephson superconducting tunnel junctions in YBa$_2$Cu$_3$O$_{7-\delta}$ directly patterned with a focused helium ion beam", *Nature Nanotechnology*, 2015, 10(598-602), published on-line 27 April 2015.

Figure 4A:
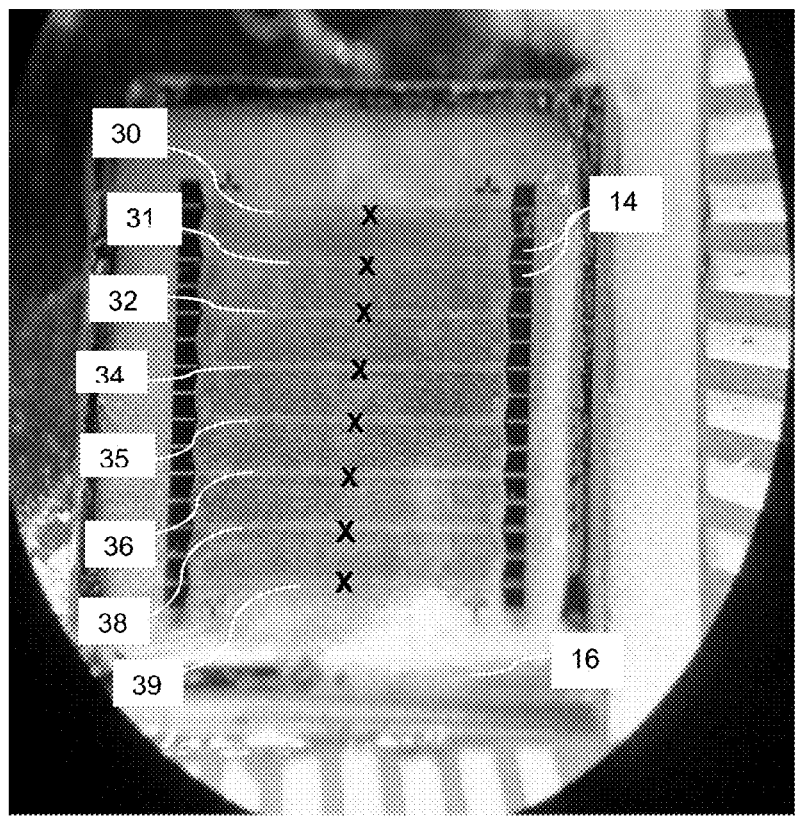
FIG. 4A is an optical micrograph of single junction devices fabricated with different bridge widths according to an embodiment of the invention.
Figure 4B:
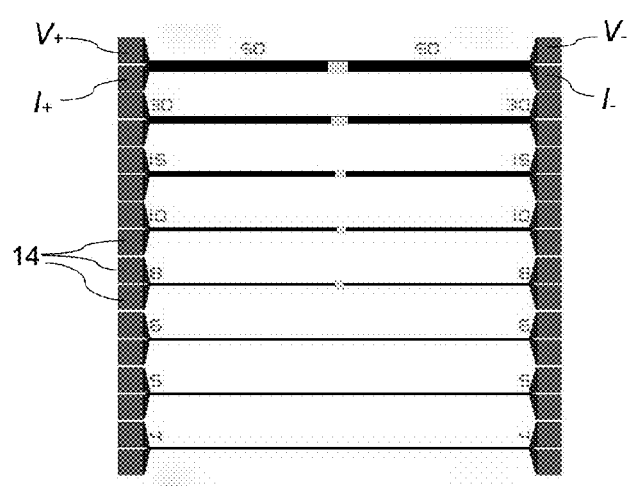
FIG. 4B is a diagrammatic view of the device of FIG. 4A.

FIG. 4A is an optical micrograph taken at 2× magnification of a test sample chip with FMFS-based devices fabricated from YBCO strips of varying bridge widths. FIG. 4B provides a diagrammatic view of the same structure, with the bridge widths indicated. As previously described, bridge width W impacts the Josephson penetration depth, determining whether the junction is considered "long" or "short." The actual junctions are too small to be seen in the photographic image, but are indicated by the black "Xs. In FIG. 4B, the junctions are illustrated as the light gray areas in the centers of the wider strips (not shown in the narrower strips.) The devices 30-39 have bridge widths W of 50 µm, 30 µm, 15 µm, 10 µm, 5 µm, 6 µm, 5 µm and 4 µm, from top to bottom of the image. Bond pads 14 are shown in both images, with the voltage and current connections for the 50 µm bridge indicated in FIG. 4B.

Figure 5A:
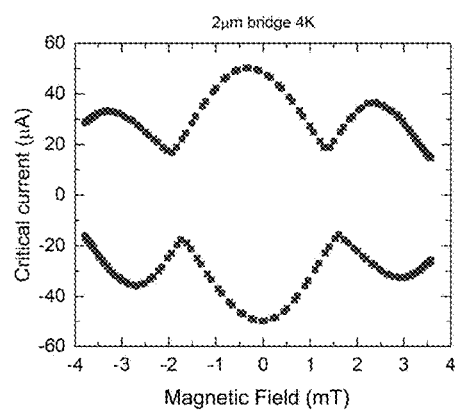
FIGS. 5A-5G are plots of critical current versus flux demonstrating the evolution of bridge width and the increasingly linear behavior with increasing bridge width.
Figure 5B:
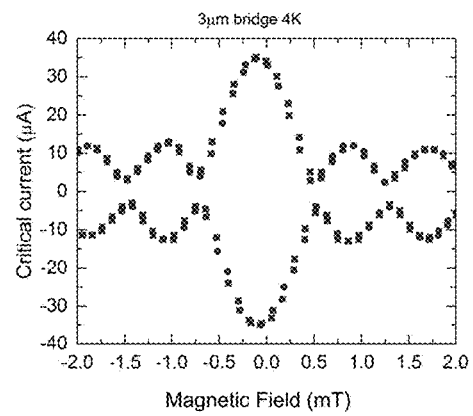
Figure 5C:
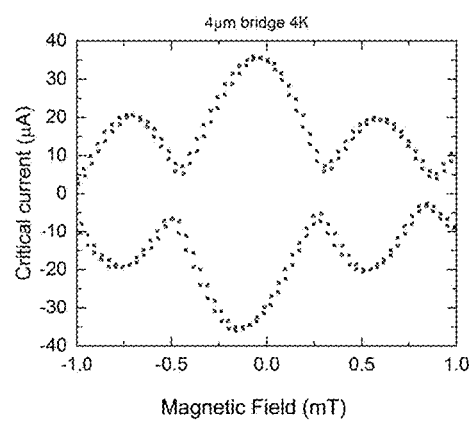
Figure 5D:
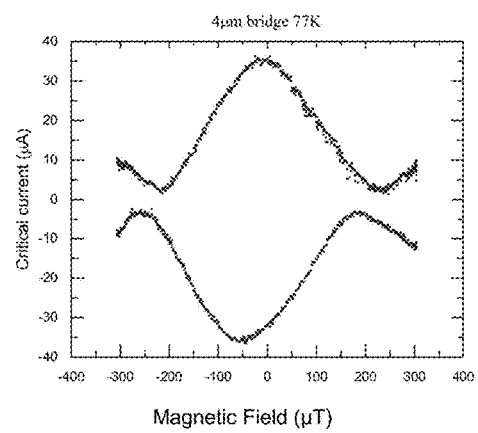
Figure 5E:
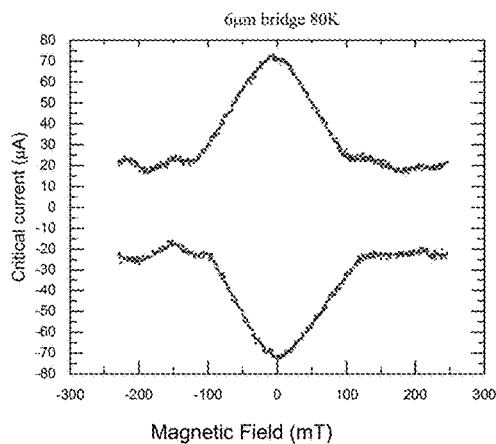
Figure 5F:
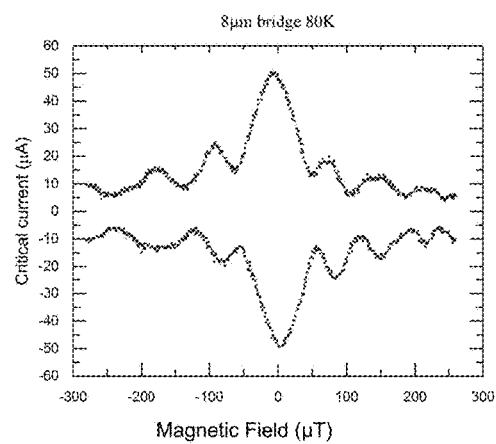
Figure 5G:
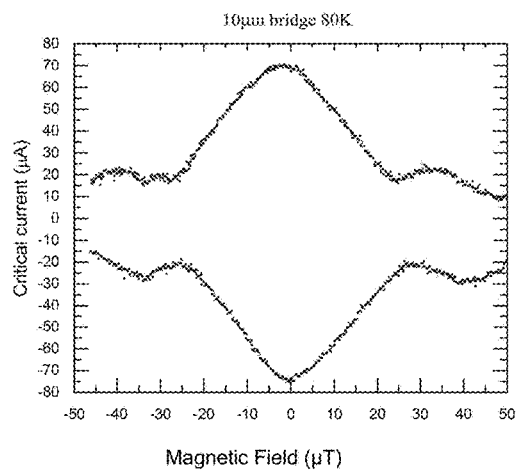
Figure 6A:
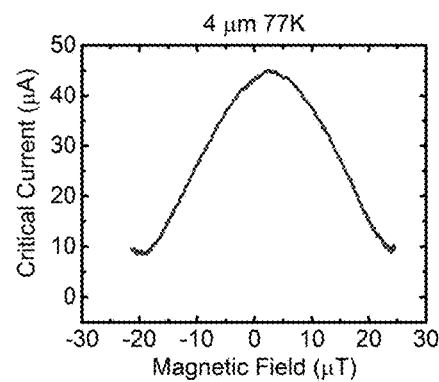
FIG. 6A-6D illustrate increasing linearity and skew in the central peak with increasing bridge width.
Figure 6B:
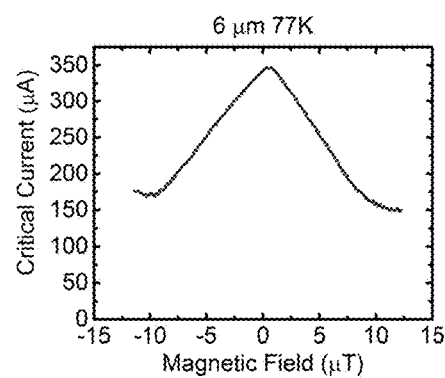
Figure 6C:
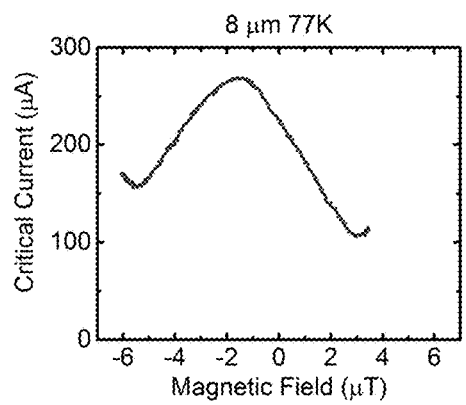
Figure 6D:
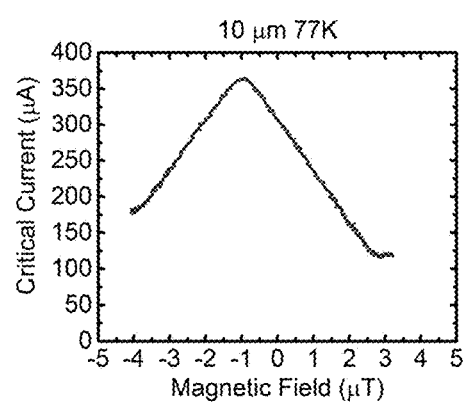

FIGS. 5A-5G provide the results of the evaluation of bridge width and its impact on device response. FIG. 5A shows the critical current versus flux pattern for a 2 µm bridge width at a temperature of 4K. FIG. 5B is a plot of critical current versus flux for a 3 µm bridge width at a temperature of 4K. FIGS. 5C and 5D are plots of critical current versus flux for a 4 µm bridge width at 4K and 77K, respectively. FIG. 5E shows the pattern for a 6 µm bridge width at 80K. FIG. 5F provides the results of an 8 µm bridge at 80K. FIG. 5G provides the results for a 10 µm bridge at 80K. The Josephson penetration depth for this set of experiments is around 3-4 µm. Looking at the evolution of the patterns, it can be seen that the degree of roundness of the center peaks diminishes (i.e., becomes sharper) as bridge width increases. For bridge widths greater than 6 µm, the curves in the pattern are replaced by a linear slope. The shape of the pattern is the most important, because the sensitivity and the dynamic range can be adjusted by the number of junctions in series. What is demonstrated by these results is that the shorter junctions have a round center peak whereas in the longer junctions, the center peak transitions to a triangle. The increased sharpness of the slope with increasing bridge width corresponds to greater sensitivity due to the larger area ($\Phi=BA$). It should be noted that the data were obtained using different devices. Also, the operating temperature can be tuned anywhere within a range of 4K to 80K.

FIGS. 6A-6D provide an additional example of how linearity and skew in the central peak increase with increasing bridge width. Single junctions with bridge widths of 4, 6, 8 and 10 µm were tested at 77K, with the results plotted in FIGS. 6A-6D, respectively. Devices larger than 10 microns did not function properly because the width became too large.

A close-spaced series array with 1000 meanders, 10 µm bridge width, and 100 nm junction spacing fabricated on a 1 cm×1 cm area chip would produce a device having $10^9$ junctions. Using the results shown in FIG. 6D, the $I_C R$ product for a single junction (250 µA×0.13Ω) would be 32.5 µV. Modulation of the critical current to zero (a change in magnetic field of 35 µT) for a single junction corresponds to ~1 V/T, which, for $10^9$ junctions produces 1 V/nT.

Figure 7A:
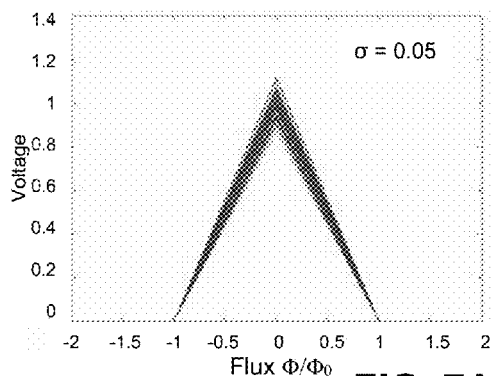
FIGS. 7A-7F provide results of a simulation investigating the effects of critical current non-uniformity on a long Josephson junction amplifier for a standard deviation σ=0.05 and 0.10.
Figure 7B:
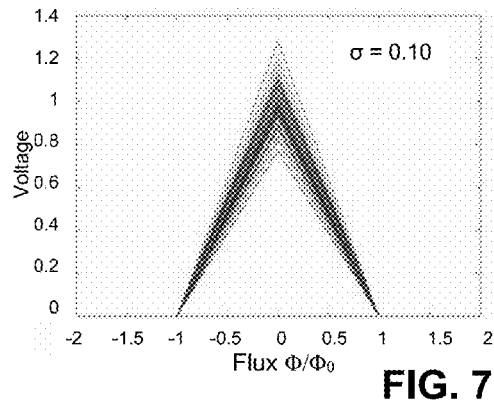
Figure 7C:
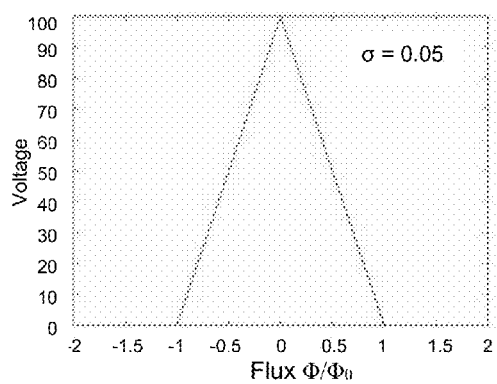
Figure 7D:
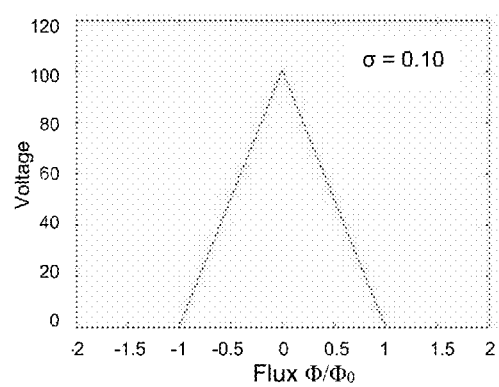
Figure 7E:
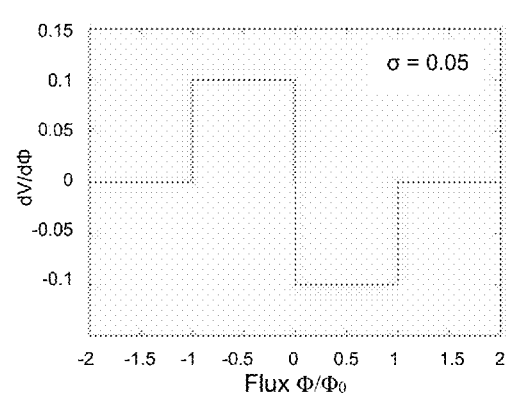
Figure 7F:
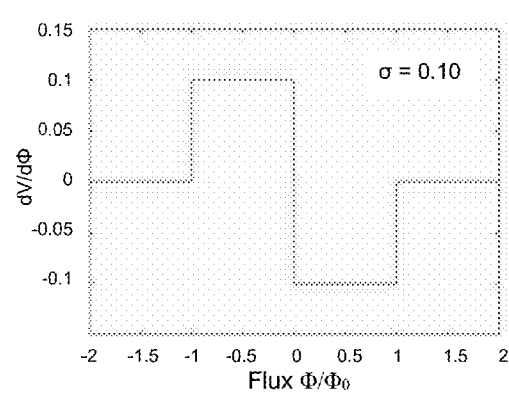
Figure 8A:
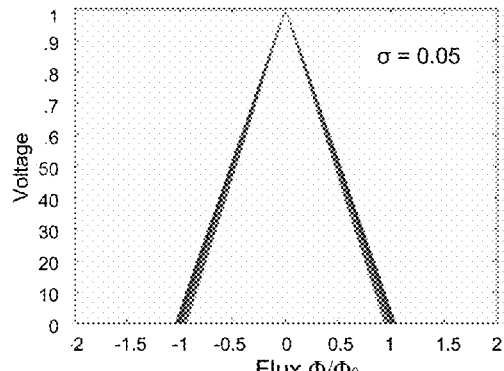
FIGS. 8A-8F show results of a simulation investigating the effects of lithographically-defined junction area non-uniformity on a 100 junction array for a standard deviation σ=0.05 and 0.10.
Figure 8B:
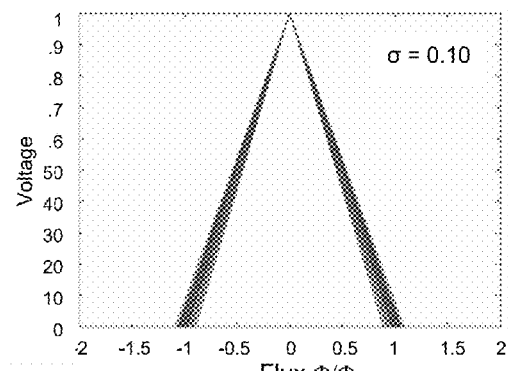
Figure 8C:
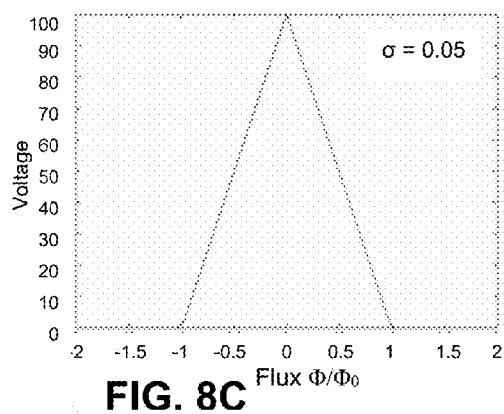
Figure 8D:
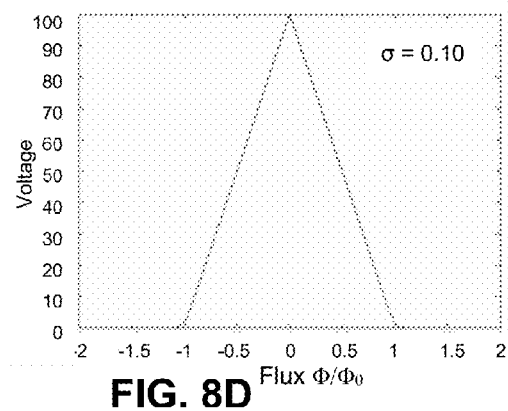
Figure 8E:
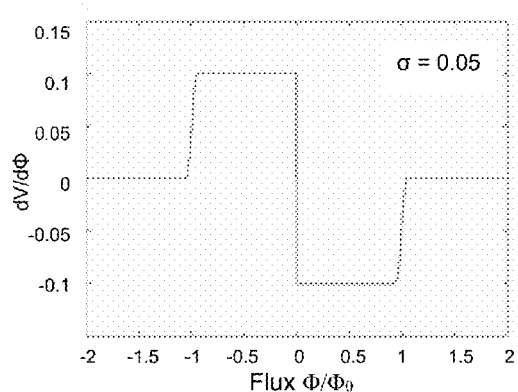
Figure 8F:
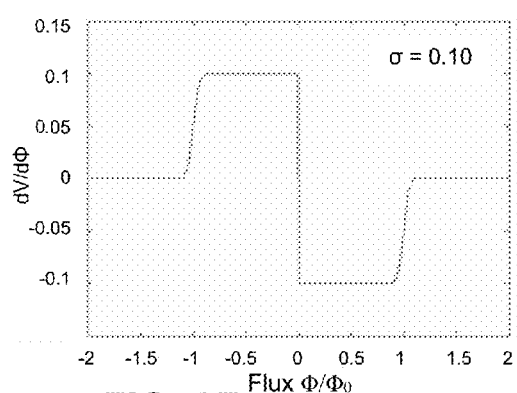

To investigate the effects that non-uniform critical currents might have on the linearity and dynamic range of such an array, we simulated a linear array of $I_{C(B)}$ patterns by summing the voltages of triangular shaped functions of different amplitudes for both a 0.10 and 0.05 critical current standard deviation. FIG. 7A illustrates the voltage-flux characteristic of each junction for σ=0.05, FIG. 7B shows the results for each junction for σ=0.10. For all junctions summed, the results are shown in FIGS. 7C and 7D for σ=0.05 and 0.10, respectively. FIGS. 7E and 7F plot the slopes of all junctions for σ=0.05 and 0.10, respectively. Based on these results, there appeared to be little or no effect on range or linearity for either case. Our current junctions have been demonstrated with standard deviations in critical current of around 0.12. To simulate variation in junction area, triangles of different periodicity were evaluated for a 100 junction array. The results, provided in FIGS. 8A-8F, indicate that linearity is not affected and dynamic range is only slightly reduced for a 0.10 standard deviation in junction area compared to 0.05. As in the previous simulation, FIGS. 8A and 8B show the voltage-flux characteristic for each junction for a variation in junction area of σ=0.05 and 0.10, respectively, FIGS. 8C and 8D provide the characteristic for the sum of all 100 junctions for σ=0.05 and 0.10, and FIGS. 8E and 8F provide the slope of all junctions for σ=0.05 and 0.10, respectively.

Figure 9A:
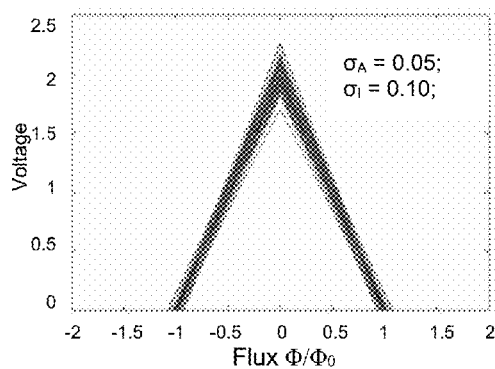
FIGS. 9A-9F show results of a simulation combining both the effects of lithographically-defined junction area non-uniformity and critical current non-uniformity on a long Josephson junction amplifier.
Figure 9B:
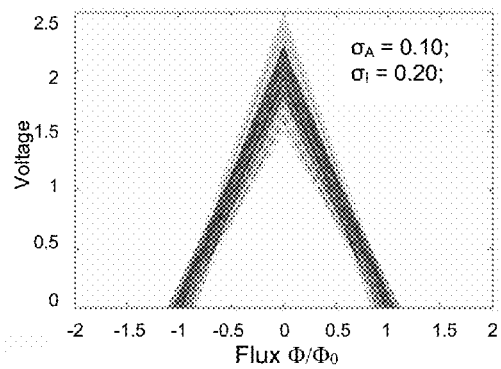
Figure 9C:
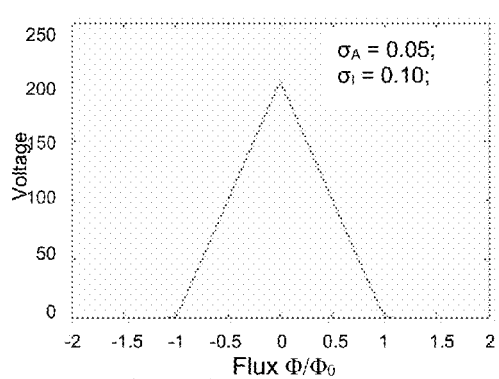
Figure 9D:
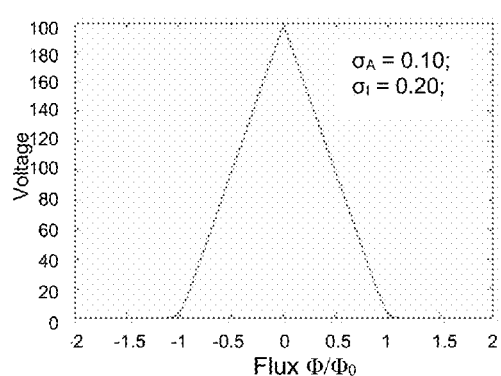
Figure 9E:
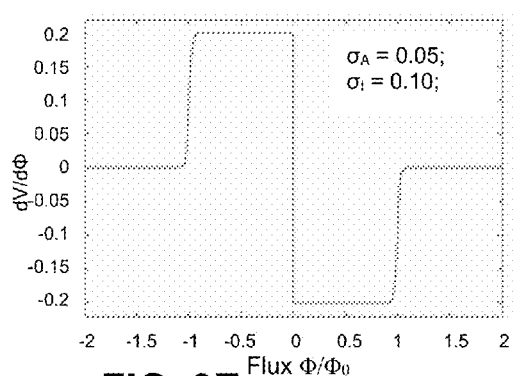
Figure 9F:
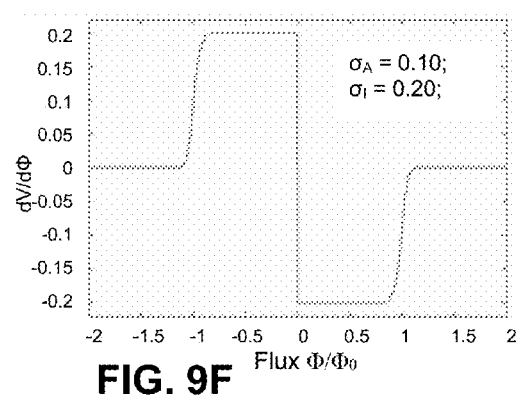

The effect of a combination of variations in both effects (critical current non-uniformity and junction area variation) on a long Josephson junction amplifier is demonstrated in the simulation results shown in FIGS. 9A-9F. Area variation is determined by lithographic error (which is very small, especially for long junctions) to be ~0.02 standard deviation from the mean area. The derivative shows a very small reduction in dynamic range, which can easily be compensated for by adding more junctions. FIGS. 9A and 9B show the voltage-flux characteristics for each junction for a variation in junction area of $\sigma_A$=0.05 and 0.10, and a variation in critical current of $\sigma_I$=0.10 and 0.20, respectively. FIGS. 9C and 9D provide the characteristics for the sum of all 100 junctions for $\sigma_A$=0.05 and 0.10, and $\sigma_I$=0.10 and 0.20. FIGS. 9E and 9F provide the slope of all junctions for $\sigma_A$=0.05 and 0.10, and $\sigma_I$=0.10 and 0.20, respectively.

Figure 10A:
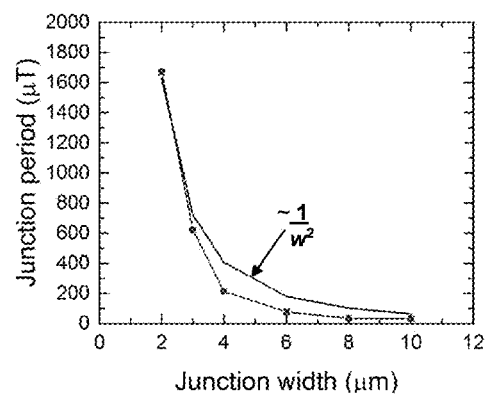
FIG. 10A-10B are plots of the junction period of the magnetic field pattern vs. junction width.
Figure 10B:
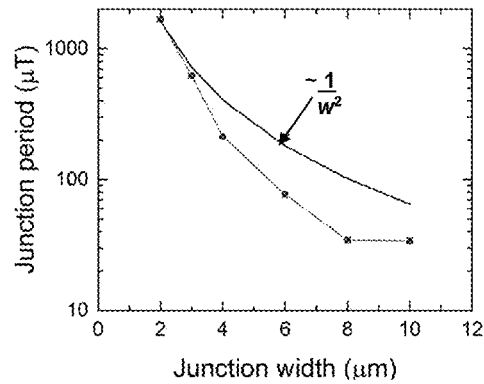

FIG. 10A-10B are plots of the junction period of the magnetic field pattern vs. junction width, demonstrating how larger bridge width substantially reduces the field period and, hence, increases sensitivity. The upper line in each plot is proportional to $1/w^2$, where w is the bridge width.

Figure 11:
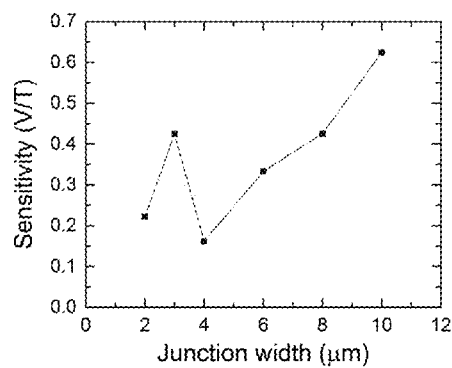
FIG. 11 is a plot of junction sensitivity as a function of junction width.

Sensitivity can be defined as the slope of the magnetic field pattern operated in voltage mode dV/dB. To evaluate sensitivity, the device is biased with a static current above the critical current and voltage is detected. In FIG. 11, sensitivity is plotted as a function of junction width, demonstrating that sensitivity increases with width.

Figure 12:
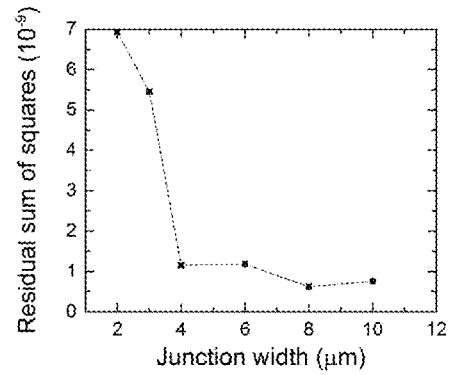
FIG. 12 is a plot showing increased junction linearity with junction width.

The linearity of a device can be analyzed by fitting a straight line (kB) from the center peak to the first minimum of the steeper side and determining the residual sum of squares from the fit. As shown in FIG. 12, the residual sum of squares of each fit decreases as the junction width increases, indicating improved linearity with increasing width.

Figure 13:
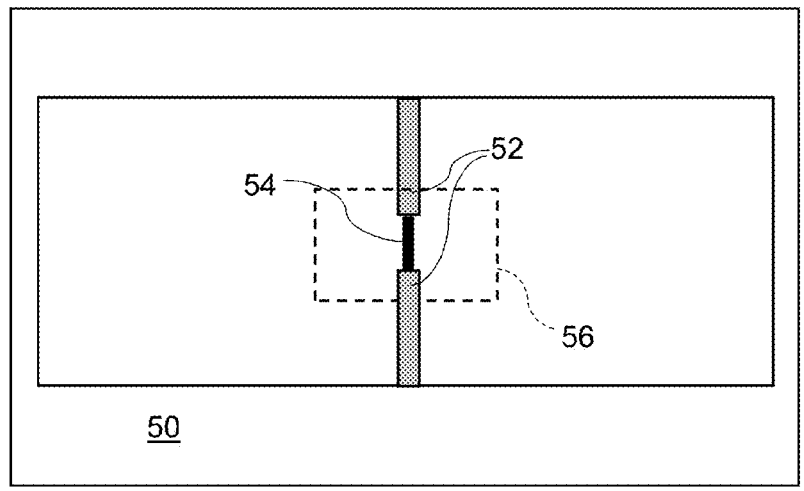
FIG. 13 is a diagrammatic view of a wide bridge device according to an embodiment of the invention.
Figure 14:
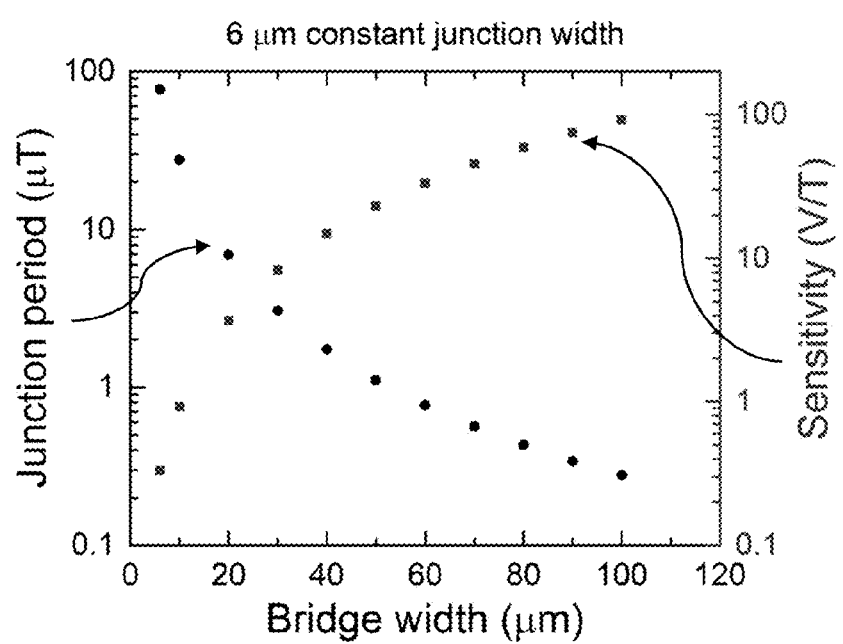
FIG. 14 is a plot of the estimated sensitivity of the wide bridge device of FIG. 13.

From these above-described tests, we learned that using a wider bridge gives greater sensitivity, however the junction should be 10 µm or less. Therefore, one approach for an optimized device is to create a junction contained inside of a much larger bridge. FIG. 13 illustrates an example of a 50 µm wide bridge with an approximately 10 µm junction inside. To build this, on substrate 50, we use a low ion dose to write the junction 54 and a very large dose to write insulating barriers 52 on the sides. The area within the dashed lines 56 corresponds to the effective junction area. FIG. 14 is a plot of the estimated sensitivity of the wide bridge device of FIG. 13 for bridge widths ranging from 4 µm up to 100 µm for a constant 6 µm junction width, where the junction period (left axis) is plotted against bridge width as indicated by the black dots, and junction sensitivity (right axis) is plotted against bridge width, indicated by the black squares.

Using the approaches described herein, a device for converting magnetic flux to voltage can be fabricated on a small substrate using relatively straightforward lithographic processes. A FMFS-based transducer can be used as a magnetic antenna, amplifier, magnetometer, magnetic field sensor or for satellite communication with very high linearity, ultra wide bandwidth, large dynamic range and high sensitivity. Such a device provides significant advantages over existing SQUID-based technologies because it is simpler and more easily commercialized. A significant additional advantage lies in the fact that the supporting electronics required for implementation of an FMFS-based antenna, amplifier and/or a magnetometer are greatly simplified relative to existing SQUID-based technologies. The inventive approach describe above is not limited to antenna-like applications, but may be used in any application requiring magnetic field sensing with high linearity and wide bandwidth, including biomedical magnetic imaging and magnetic microscopes.

REFERENCES (INCORPORATED HEREIN BY REFERENCE)

1. V. Martin et al., "Magnetometry based on sharpened high $T_C$ GBJ Fraunhofer patterns", *IEEE Trans. Appl. Supercond.* 7(2):3079-3082, 1997.
2. J. Clarke and A. Braginski (Eds.), *The SQUID Handbook: Fundamentals and Technology of SQUIDs and SQUID Systems*, Volume I, and *The SQUID Handbook: Applications of SQUIDs and SQUID Systems*, Volume II, Wiley-VCH Verlag GmbH & Co., 2006.
3. A. V. Shadrin, et al., "Fraunhofer regime of operation for superconducting quantum interference filters", *Appl. Phys. Lett.* 93(26):262503, 2008.
4. C. D. Tesche and J. Clarke, "dc SQUID: Noise and Optimization", *J. Low Temp. Phys.*, 29(3/4):301-331, 1977.
5. K. Chen, et al., "Planar thin film $YBa_2Cu_3O_{7-\delta}$ Josephson junction pairs and arrays via nanolithography and ion damage", *Appl. Phys. Lett.* 85(14): 2863-2865, 2004.
6. K. Chen, et al., "Study of closely spaced $YBa_2Cu_3O_{7-\delta}$ Josephson junction pairs", *IEEE Trans. on Appl. Supercond.*, 15(2):149-152, 2005.
7. S. A. Cybart, et al., "Planar $YBa_2Cu_3O_{7-\delta}$ ion damage Josephson junctions and arrays", *IEEE Trans. on Appl. Supercond.*, 15(2): 241-244, 2005,
8. S. A. Cybart et al., "Temporal Stability of Y—Ba—Cu—O Nano Josephson Junctions from Ion Irradiation," *IEEE Trans. on Appl. Supercond.*, 23(3): 1100103, 2013.
9. S. A. Cybart, et al. "Very Large Scale Integration of Nanopatterned $YBa_2Cu_3O_{7-\delta}$ Josephson Junctions in a Two-Dimensional Array", *Nanoletters*, 2009, 9(10): 3581-3585.
10. S. A. Cybart, et al., "Nano Josephson superconducting tunnel junctions in $YBa_2Cu_3O_{7-\delta}$ directly patterned with a focused helium ion beam", *Nature Nanotechnology*, 2015, 10 (598-602), 27 Apr. 2015.

The invention claimed is:

1. A transducer for converting magnetic flux to voltage comprising a one-dimensional linear array of long Josephson junctions disposed in a planar geometry configured to operate in a linear Fraunhofer mode to transduce magnetic fields that are perpendicular to the junction, wherein the long Josephson junction has a bridge width W greater than two times the Josephson penetration depth $\lambda_J$.

2. The transducer of claim 1, wherein the array comprises from 1 to $10^9$ long Josephson junctions.

3. The transducer of claim 1, wherein the planar geometry is selected from lines, spirals, circles, meanders, or combinations thereof.

4. The transducer of claim 1, wherein the planar geometry comprises a meandering line having from 10 to $10^6$ meanders.

5. The transducer of claim 1, wherein the Josephson junctions have bridge width W is within a range of 4 to 100 µm.

6. The transducer of claim 1, wherein the junction width is less than 10 µm and the bridge width W is in a range of 50 to 100 µm.

7. The transducer of claim 1, wherein the long Josephson junctions have a bridge width within a range of 4 to 10 µm.

8. The transducer of claim 1, wherein the array is arranged in series, parallel, or series-parallel.

9. The transducer of claim 1, further comprising a plurality of bond pads in electrical communication with the array.

10. The transducer of claim 1, wherein the array of long Josephson junctions is formed from an YBCO superconductor.

11. The transducer of claim 1, wherein the array of long Josephson junctions is formed in a superconducting material selected from the group consisting of Nb, Pb, Al, $MgB_2$, and cuprates.

12. The transducer of claim 1, wherein the long Josephson junctions comprise junction barriers selected from the group consisting of Superconductor-Insulator-Superconductor (SIS), Superconductor-Normal Metal-Superconductor (SNS), and Superconductor-diminished superconductor-Superconductor (SS'S).

13. The transducer of claim 1, wherein the long Josephson junctions comprise a junction selected from the group consisting of ion damage Josephson junctions, SIS trilayers, step-edge junctions, bicrystal junctions, grain boundary junctions, and ramp junctions.

14. A device for converting magnetic flux to voltage comprising:
   a one-dimensional planar array of long Josephson junctions disposed on a substrate, where the planar array is configured in a geometry selected from line, spiral, circle, meandering line, and combinations thereof, wherein each long Josephson junction has a bridge width greater than two times the Josephson penetration depth; and
   a plurality of contacts disposed on the substrate in electrical communication with the planar array.

15. The device of claim 14, wherein the planar geometry comprises a meandering line comprising from 10 to $10^6$ meanders.

16. The device of claim 14, wherein the array of long Josephson junctions comprises from 1 to $10^9$ junctions.

17. The device of claim 14, wherein the bridge width is within a range of 4 to 100 μm.

18. The device of claim 14, wherein the junction width is less than 10 μm and the bridge width is in a range of 50 to 100 μm.

19. The device of claim 14, wherein the long Josephson junctions have a bridge width within a range of 4 to 10 μm.

20. The device of claim 14, wherein the array is arranged in series, parallel, or series-parallel.

21. The device of claim 14, wherein the array of long Josephson junctions is formed from an YBCO superconductor.

22. The device of claim 14, wherein the array of long Josephson junctions is formed in a superconducting material selected from the group consisting of Nb, Pb, Al, $MgB_2$, and cuprates.

23. The device of claim 14, wherein each long Josephson junction comprises junction barriers selected from the group consisting of Superconductor-Insulator-Superconductor (SIS), Superconductor-Normal Metal-Superconductor (SNS), and Superconductor-diminished superconductor-Superconductor (SS'S).

24. The device of claim 14, wherein each long Josephson junction comprises a junction selected from the group consisting of ion damage Josephson junctions, SIS trilayers, step-edge junctions, bicrystal junctions, grain boundary junctions, and ramp junctions.

\* \* \* \* \*